(12) United States Patent
Chang et al.

(10) Patent No.: US 11,579,170 B2
(45) Date of Patent: Feb. 14, 2023

(54) PROBE APPARATUS

(71) Applicant: CHROMA ATE INC., Taoyuan (TW)

(72) Inventors: Chin-Yuan Chang, Taoyuan (TW);
Chun-Hao Hu, Taoyuan (TW);
Hsueh-Cheng Hsieh, Taoyuan (TW);
Ming-Hui Chen, Taoyuan (TW)

(73) Assignee: Chroma Ate Inc., Taoyuan (TW)

( * ) Notice: Subject to any disclaimer, the term of this patent is extended or adjusted under 35 U.S.C. 154(b) by 0 days.

(21) Appl. No.: 17/393,724

(22) Filed: Aug. 4, 2021

(65) Prior Publication Data

US 2022/0178967 A1 Jun. 9, 2022

(30) Foreign Application Priority Data

Dec. 4, 2020 (TW) ................................. 109142860

(51) Int. Cl.
*G01R 1/067* (2006.01)

(52) U.S. Cl.
CPC ...... *G01R 1/06711* (2013.01); *G01R 1/06766* (2013.01)

(58) Field of Classification Search
CPC .......................... G01R 1/06711; G01R 1/06766
See application file for complete search history.

(56) References Cited

U.S. PATENT DOCUMENTS

| 7,167,010 B2* | 1/2007 | Hembree | G01R 1/07357 324/756.07 |
| 7,951,709 B2* | 5/2011 | Pratt | H01L 24/02 438/666 |
| 2008/0309362 A1* | 12/2008 | Jeon | G01R 1/07342 324/755.11 |
| 2019/0361051 A1* | 11/2019 | Vettori | G01R 1/0735 |

* cited by examiner

*Primary Examiner* — Paresh Patel
(74) *Attorney, Agent, or Firm* — Rosenberg, Klein & Lee

(57) ABSTRACT

The present invention provides a probe apparatus, which comprises a signal transmission device, a probe, and a bottom fixing device. The signal transmission device includes a first transmission part and a second transmission part. An end of the probe is connected electrically below the second transmission part. The bottom fixing device is disposed below the signal transmission device. An end of the bottom fixing device includes a first penetrating hole and a first recess is disposed below the end. The probe passes through the first penetrating hole of the bottom fixing device. The probe is located in the first recess. The bottom fixing device reinforces the mechanical strength of the signal transmission device so that the width of the signal transmission device can be reduced. Thereby, the benefit of high-density arrangement of the probe apparatus can be achieved.

6 Claims, 5 Drawing Sheets

PROBE APPARATUS

FIELD OF THE INVENTION

The present invention relates to a probe apparatus, and particularly to a probe apparatus having a signal transmission device, a top fixing device, and a bottom fixing device.

BACKGROUND OF THE INVENTION

The design of a probe card is to set a probe at the locations corresponding to each test point to be tested and to set an alignment mark corresponding to an identification mark on the circuit under test. To use a probe card, the alignment mark on the probe card is first aligned to the identification mark on the circuit under test to complete alignment. Then, by means of probes, various testing signals can be applied to different electronic devices and wires on integrated circuits via the test points. The received response signals can be calculated by computer programs to produce testing results.

Cantilever probe cards are the probe cards developed earliest and applied most extensively. The main arm of this type of probe cards extends horizontally towards the pads of the circuit under test. The end of the probe cards is bent by an angle to contact the pad of the circuit under test or contacts the pad horizontally. In this type of probe cards, a plurality of probes are fixed by using thermoplastics such as epoxy resin. The plasticity of each probe cantilever should be calibrated within a specified range.

While testing high-frequency electronic devices with high-density pads, to avoid deformation of cantilever probes, which will influence the testing results, the thickness or diameter of cantilever probes must be kept within a certain value and hence maintaining proper rigidity and elasticity. Consequently, the arrangement of the probes cannot be dense enough to meet the requirement for tests of high-frequency electronic devices with high-density pads. Some probe manufacturers have developed probes with different lengths arranged alternately in three dimensions for achieving high-density arrangement of massive probes, the problem of pad puncture on devices under test might occur owing to uneven force by probes.

Thanks to the progresses in the photo etching technology, the micromachining probe card technology is developed to mass produce probes. High-precision fine probes are manufactured using electroplating and photo etching technologies. In addition, piezoelectric materials are adopted to enable pressure feedback of each probe. Thereby, the contact force by probes can be guaranteed to be equal and thus minimizing unnecessary factors and improving testing reliability. Unfortunately, as the pads of high-frequency electronic devices become denser, the surface flatness of the circuit under test is nonuniform and inducing the problem of height difference among pads. The probes must be able to maintain excellent electrical contact with each pad with different heights. Thereby, each probe should be designed elastic to prevent unduly difference in the contact force among probes. If not, chips or probes might be damages and the testing results would be inaccurate. Nonetheless, the probes adaptive to height difference must be fabricated using the electroplating and photo etching methods, which are difficult and hence the manufacturing costs are intimidating. Besides, the methods include expensive special-purpose masks. Consequently, they always encounter the problem of high costs.

Given the problems faced by the prior art, it is urged in the market to have a high-density probe apparatus with convenient maintenance, friendliness to the test points of the circuit under test, low manufacturing costs, and low operational costs. Accordingly, the present invention provides a probe apparatus with the features of multi-stage elastic cushioning and vertical contact. Thereby, the requirements of easy maintenance, not damaging the circuit under test, high-density arrangement, and low costs.

SUMMARY

According to an objective of the present invention, a probe apparatus is provided and comprises a signal lead-out device, a signal transmission device, a bottom fixing device, and a probe. The signal transmission device is disposed on the bottom fixing device for reinforcing the mechanical strength of the signal transmission deice with reduced width and thickness and hence applicable to finer probes. Thereby, the purposes of easy maintenance, not damaging the circuit under test, high-density arrangement, and low costs can be achieved.

Another objective of the present invention is to provide a probe apparatus, in which the signal transmission device includes a first transmission and a second transmission part with different widths. By making the elasticity of the first transmission part greater than that of the second transmission part and disposing the probe below the first transmission part with better elasticity, the purpose of avoiding damage on the circuit under test by the probe can be achieved.

To achieve the above objectives and benefits, the probe apparatus according to an embodiment of the present invention comprises a signal transmission device, a probe, and a bottom fixing device. The signal transmission device is disposed below a top fixing device and includes a first transmission part and a second transmission part. A first width of the first transmission part is greater than a second width of the second transmission part. An end of the probe is connected electrically to and disposed below the second transmission part. The bottom fixing device is disposed below the signal transmission device. The bottom fixing device includes a first penetrating hole at an end and a first recess below that end. The probe passes through the first penetrating hole of the bottom fixing device. The probe is located in the first recess.

DETAILED DESCRIPTION

In order to make the structure and characteristics as well as the effectiveness of the present invention to be further understood and recognized, the detailed description of the present invention is provided as follows along with embodiments and accompanying figures.

In the following description, various embodiments of the present invention are described using figures for describing the present invention in detail. Nonetheless, the concepts of the present invention can be embodied by various forms. Those embodiments are not used to limit the scope and range of the present invention.

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to".

The probe cards according to the prior art have the drawbacks of difficulty in maintenance, high possibility of damaging the test points of the circuit under test, high costs, and difficulty in high density. Accordingly, the present invention provides a probe apparatus, which comprises a signal lead-out device, a top fixing device, a signal transmission device, a bottom fixing device, and a probe. The top fixing device and the bottom fixing device clips and secures the signal transmission device for reinforce the mechanical strength of the signal transmission device with reduced width and thickness and applicable to finer probes. Thereby, the above drawbacks of the probe cards according to the prior art can be solved.

Figure 1:
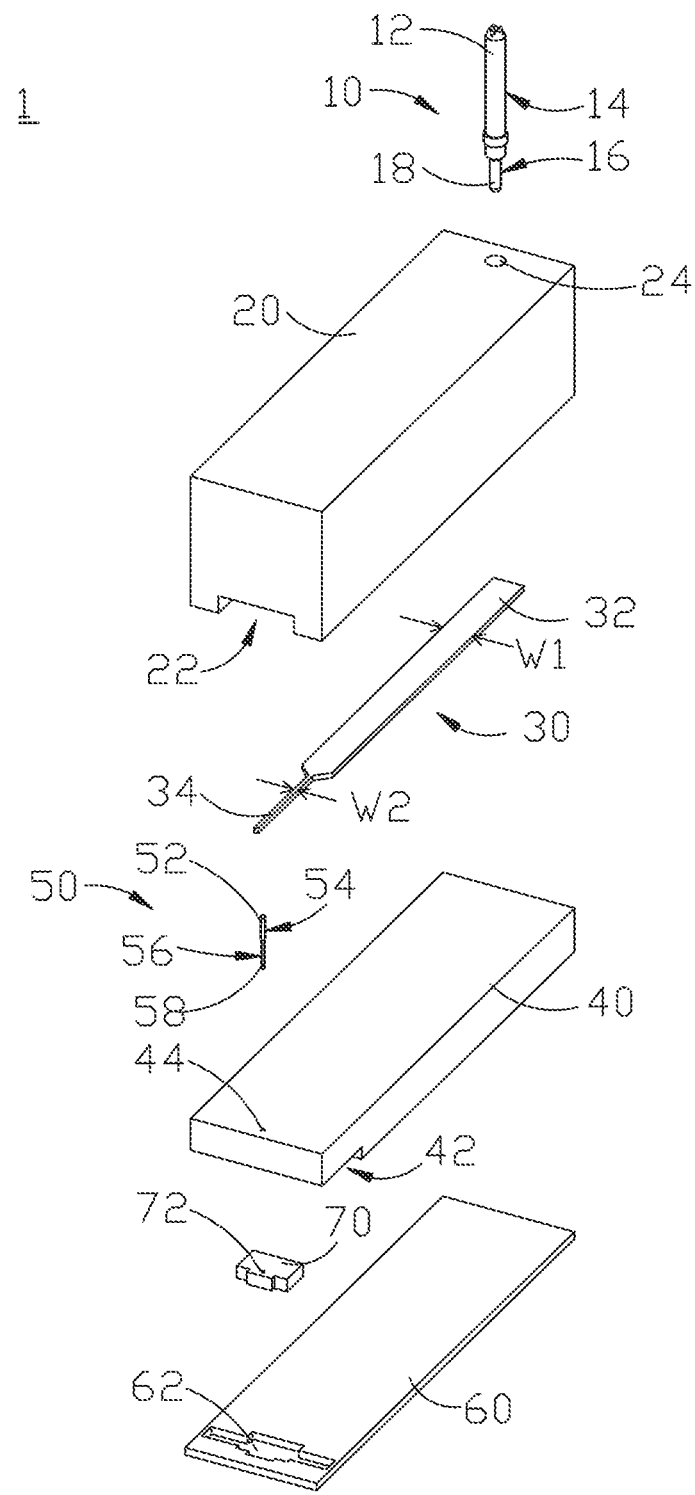
FIG. 1 shows an exploded view according to an embodiment of the present invention.

In the following, the characteristics and the accompanying structure of the probe apparatus according to the present invention will be further described. First, please refer to FIG. 1, which shows an exploded view according to an embodiment of the present invention. As shown in the figure, the probe apparatus 1 according to the present embodiment comprises a signal transmission device 30, a bottom fixing device 40, and a probe 50. The signal transmission device 30, for example, an elastic steel thin plate, includes a first transmission 32 with a first width W1 and a second transmission part 34 with a second width W2 and opposing to the first transmission part 32. The elasticity and flexibility of the first transmission part 32 is made to be superior to those of the second transmission part 34. The bottom fixing device 40, for example, a heat-resistant ceramic material or an insulative engineering plastic bar. According to the present embodiment, the bottom fixing device 40 includes a first penetrating hole at an end and a first recess 42 below that end. The probe 50, for example, a spring probe with double-ended solid copper pins and a hollow section, includes an output part 52, a third diameter part 54, a fourth diameter part 56, and a testing part 58.

According to the present embodiment, the probe apparatus 1 further comprises a signal lead-out device 10 and a top fixing device 20. The signal lead-out device 10, for example, a copper needle, includes a lead-out part 12 for soldering with a signal line, a first diameter part 14, a second diameter part 16, and a bottom part 18. The top fixing device 20 can be, for example, a heat-resistant ceramic material or an insulative engineering plastic bar. According to the present embodiment, the top fixing device 20 includes a second recess below an end and a second penetrating hole at the other end.

According to the present embodiment, the probe apparatus 1 further comprises a substrate 60 and a limiter 70. The substrate 60, for example, a Teflon thin plate or a ceramic plate, includes an opening 62. The limiter 70, for example, an ABS engineering plastic impact-resistant block or a ceramic block, include a third penetrating hole 72.

Figure 2:
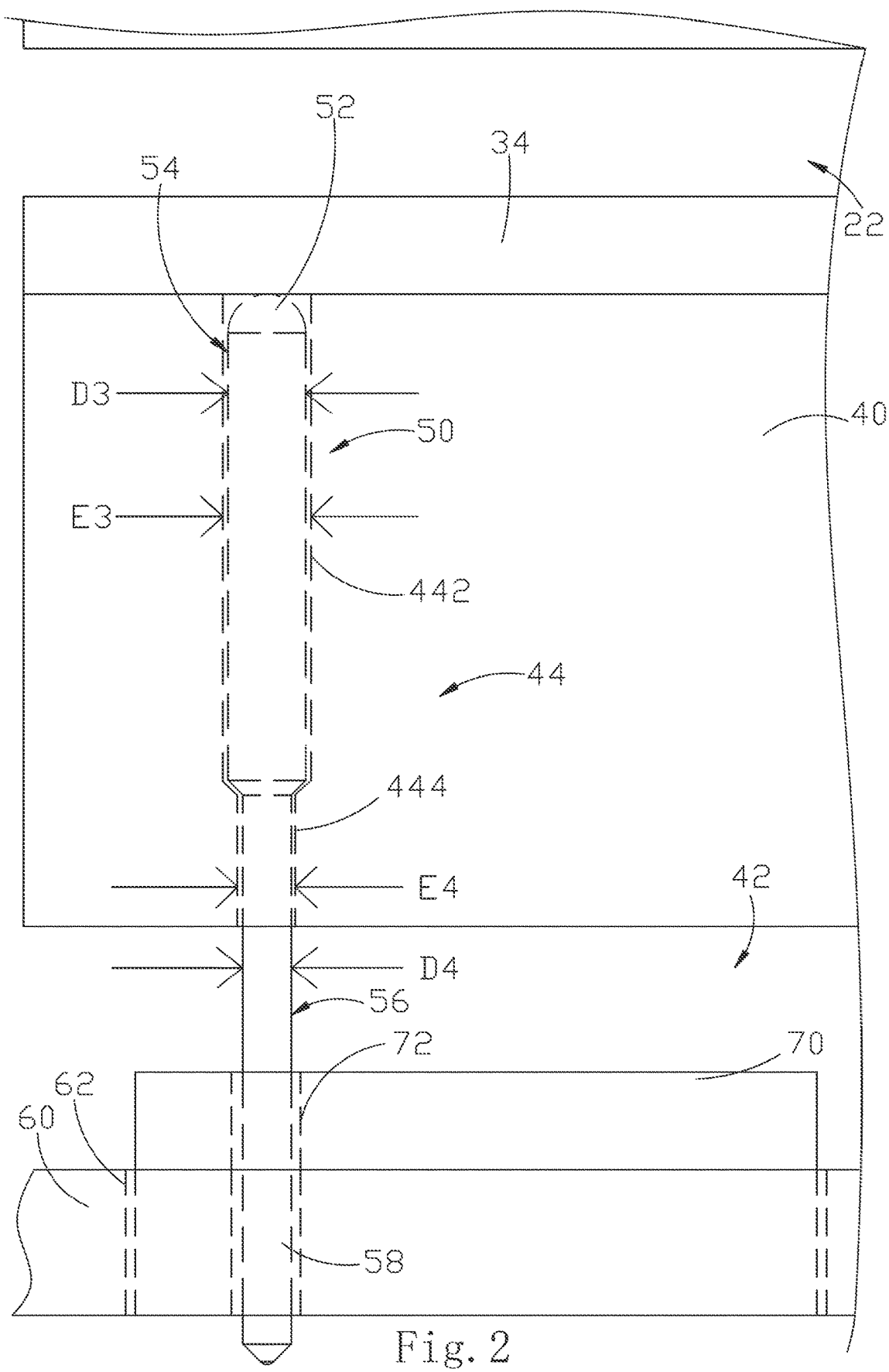
FIG. 2 shows a front view according to an embodiment of the present invention.
Figure 3:
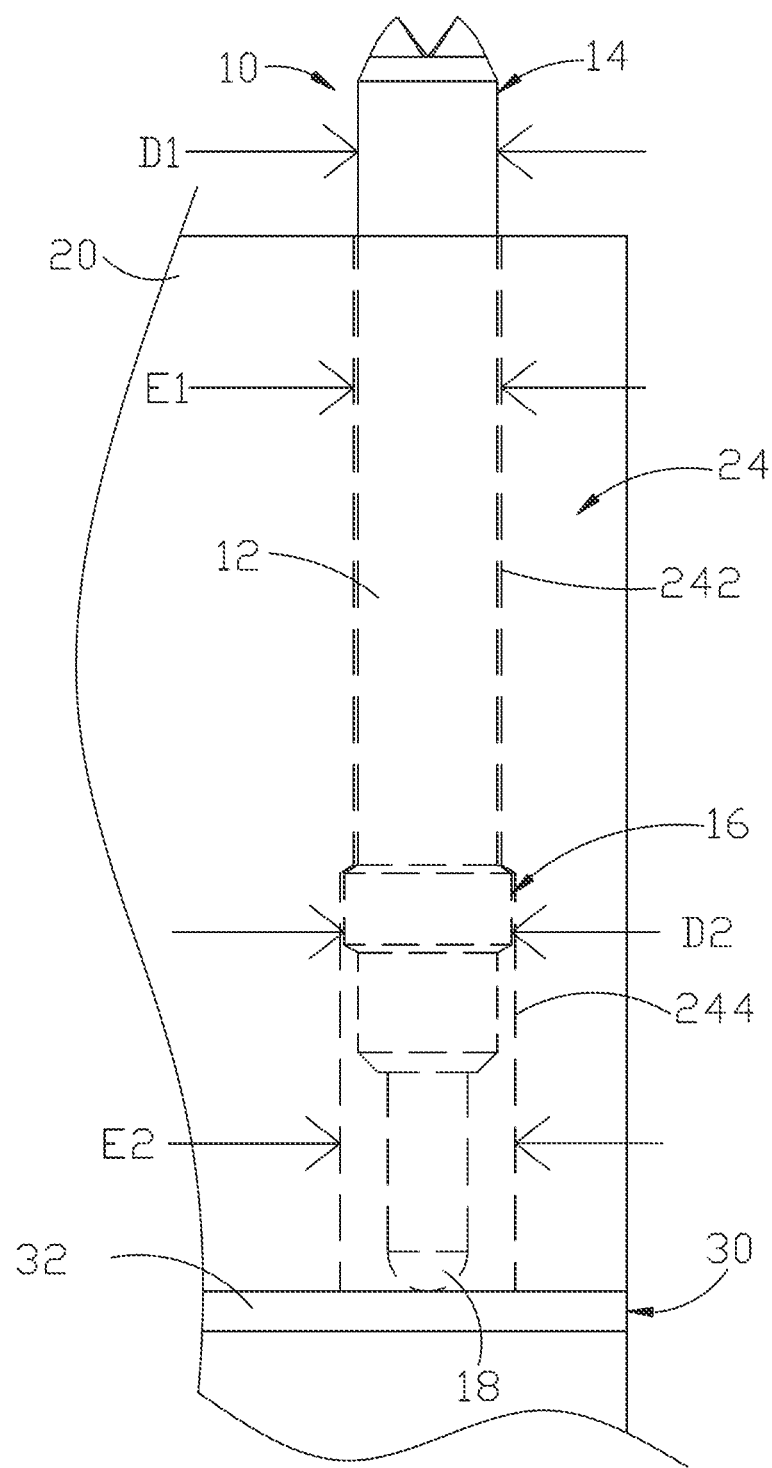
FIG. 3 shows another front view according to an embodiment of the present invention.

Please refer to FIG. 2 and FIG. 3. FIG. 2 shows a front view according to an embodiment of the present invention; FIG. 3 shows another front view according to an embodiment of the present invention. As shown in the figures, according to the present embodiment, the first penetrating hole 24 of the top fixing device 20 includes a first bore part 242 with a first bore diameter E1 and a second bore part 244 with a second bore diameter E2. The second penetrating hole 44 of the bottom fixing device 40 includes a third bore part 442 with a third bore diameter E3 and a fourth bore part 444 with a fourth bore diameter E4.

In the following, the connections of various devices and the benefits will be described. The bottom fixing device 40 is disposed below the signal transmission device 30. The first penetrating hole 44 at an end of the bottom fixing device 40 provides a path for the probe 50 to pass through as well as providing additional support for reinforcing the mechanical strength of the first transmission part 32 and the second transmission 34. Besides, the first width W1 of the first transmission part 32 is greater than the second width W2 of the second transmission part 34. One or more point of the narrower second transmission part 34 is fixed to the bottom fixing device 40 by, for example, screwing or gluing, for preventing sliding or loosing of the signal transmission device 30.

According to the present embodiment, the other end of the bottom fixing device 40 can provide support to the signal lead-out device 10 is inserted into the top of the first transmission part 32. In addition, the top fixing device 20 and the bottom fixing device 40 can clip and secure the signal transmission device 30 and hence providing a firmer structure.

The signal lead-out device 10 passes through the second penetrating hole 24 at the first end of the top fixing device 20, and is inserted into the top of the first transmission part 32 and connected electrically to the first transmission part 32. The first diameter part 14 of the signal lead-out device 10 includes a first diameter D1 corresponding to the first bore part 242 of the second penetrating hole 24; the second diameter part 16 of the signal lead-out device 10 includes a second diameter D2 corresponding to the second bore part 244 of the second penetrating hole 24. The signal transmission device 30 is disposed below the top fixing device 20 and the signal lead-out device 10. Besides, the second transmission part 34 is exposed to the second recess 22 of the top fixing device 20.

Because the first diameter D1 is approximate to the first bore diameter E1 and the second diameter D2 is approximate to the second bore diameter E2, the first diameter part 14 and the second diameter part 16 of the signal lead-out device 10 match the first bore part 242 and the second bore part 244 of the second penetrating hole 24. Since the first diameter D1 is smaller than the second diameter D2 and the first bore diameter E1 is smaller than the second bore diameter E2, the second diameter part 16 of the signal lead-out device 10 pushes against the first bore part 242 of the second penetrating hole 24. Meanwhile, the bottom part 18 of the signal lead-out device 10 is forced to be inserted to the top of the first transmission part 32 such that the signal lead-out device 10 can be inserted securely to the first transmission part 32 with excellent electrical connection.

Similarly, the third diameter part 54 includes a first diameter D3; the fourth diameter part 56 includes a fourth diameter D4.

The third diameter D3 is approximate to the third bore diameter E3 and the fourth diameter D4 is approximate to the fourth bore diameter E4. Thereby, the third diameter part 54 and the fourth diameter part 56 of the probe 50 match the third bore part 442 and the fourth bore part 444 of the first penetrating hole 44. Since the third diameter D3 is greater than the fourth diameter D4 and the third bore diameter E3 is smaller than the fourth bore diameter E4, the third diameter part 54 of the probe 50 pushes against the fourth bore part 444 of the first penetrating hole 44. Meanwhile, the output part 52 of the probe 50 is forced to be against the bottom of the second transmission part 34 such that the probe 50 can be maintained securely in the first penetrating hole 44 with excellent electrical connection with the first transmission part 32 of the signal transmission device 30.

Finally, the substrate 60 is located below the probe 50 and the bottom fixing device 40 and includes an opening 62 with the shape of the limiter 70. The limiter 70 is plugged into the opening 62 and fixed on the substrate 60. The limiter 70 includes a third penetrating hole 72 for the probe 50 to pass through.

Figure 4:
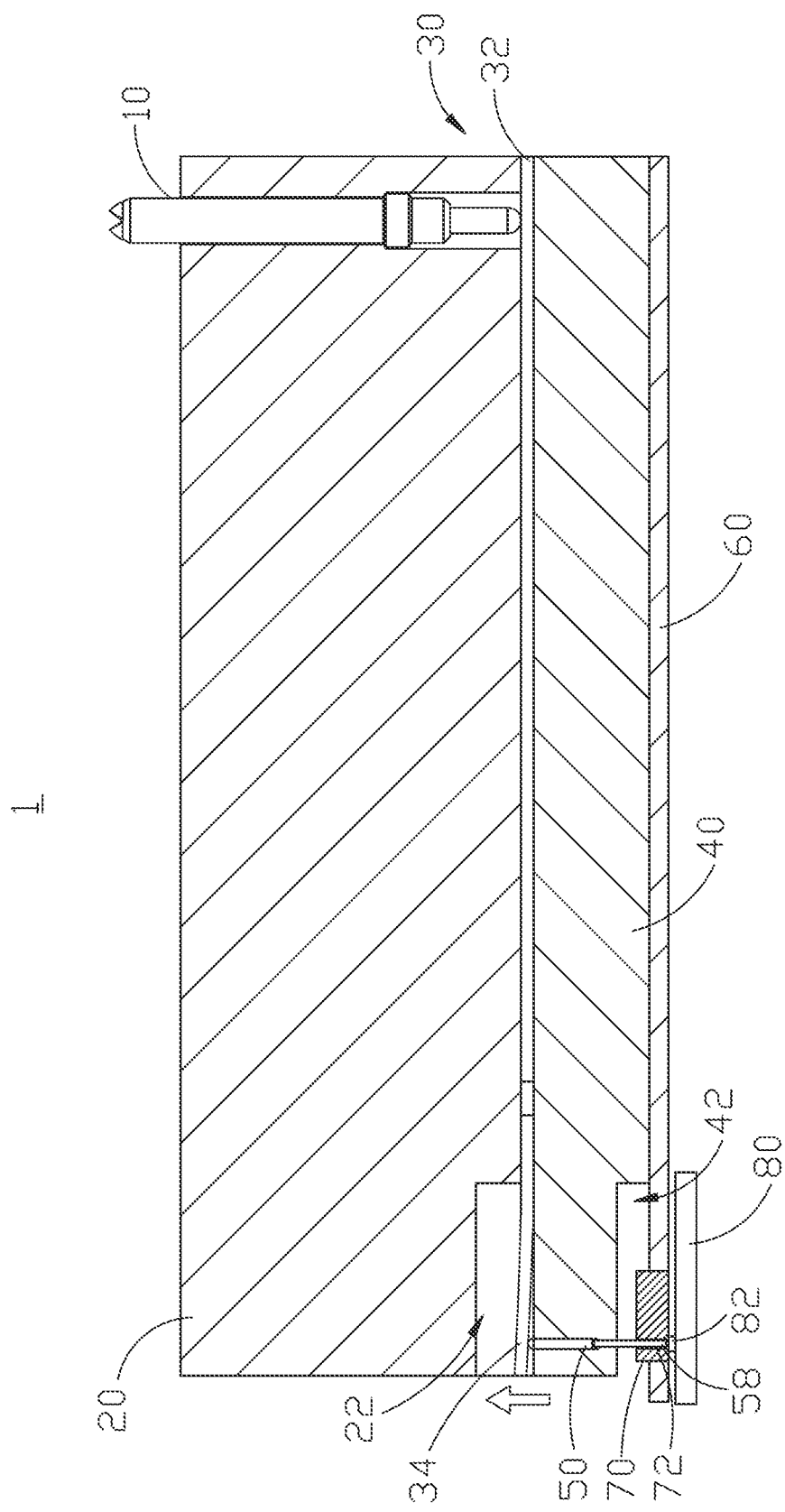
FIG. 4 shows another front view according to an embodiment of the present invention.

Please refer to FIG. 4, which shows another front view according to an embodiment of the present invention. As shown in the figure, according to the present embodiment, when the probe apparatus 1 moves towards the pad on a circuit board under test 80, the testing part 58 of the probe 50 contacts the pad 82. The probe 50 is pushed by the counterforce from the pad 82 and moves towards the second transmission part 34. The second transmission part 34 is pushed towards the second recess 22 of the top fixed device 20 and bent. By using the recovery force provided by the elasticity of the second transmission part 34, the excellent electrical connection between the testing part 58 and the pad 82 can be guaranteed. Meanwhile, the limiter 70 is located in the first recess 42 and against the bottom fixing device 40 for limiting the lifting of the probe 50. Thereby, the second transmission part 34 of the signal transmission device 30 can be controlled within the elastic deformation range and be used repeatedly by avoiding damages owing to plastic deformation.

Figure 5:
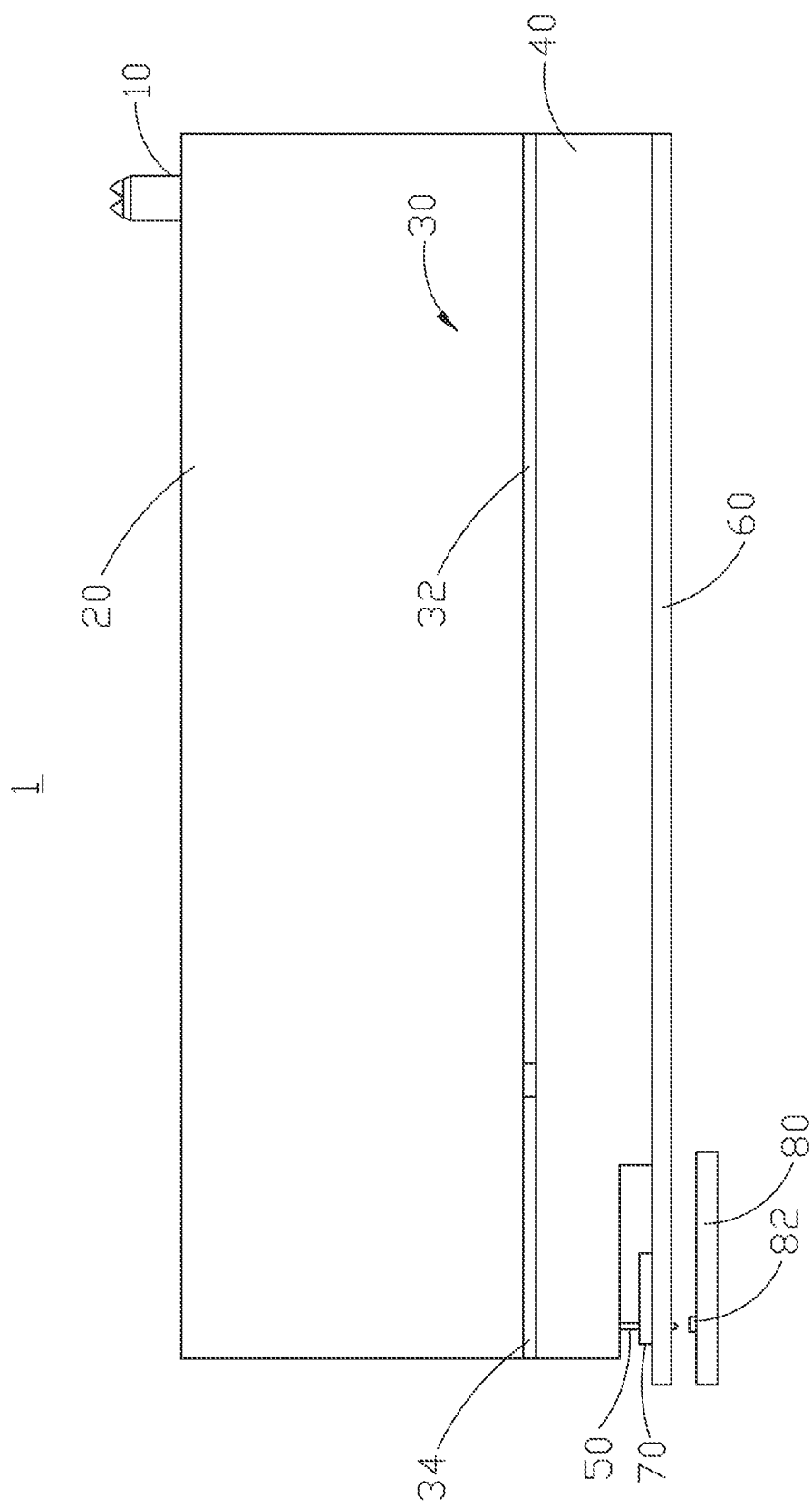
FIG. 5 shows another view according to an embodiment of the present invention.

Please refer again to FIG. 4 and FIG. 5. FIG. 5 shows another view according to an embodiment of the present invention. As shown in the figure, according to the present embodiment, after testing, the probe apparatus 1 moves away from the pad 82 of the circuit board under test 80. The elasticity of the second transmission part 34 provides the recovery force again to recover the probe 50 back to the original location.

According to the present embodiment, the bottom fixing device supports the signal transmission device for reinforcing the mechanical strength of the signal transmission device with reduced width and thickness. Thereby, the width of the probe apparatus according to the present invention can be shrunk and finer probes can be adopted. By using a plurality of the probe apparatus according to the present invention, a probe card with high-density arrangement can be implemented and applied to testing high-frequency electronic devices. In addition, by using the bottom fixing device, the soldering between the signal transmission device and the signal lead-out device and between the signal transmission device and the probe can be omitted. Consequently, the structure according to the present embodiment can be applied to a high-temperature environment with the temperature higher than the melting point of soldering points. Moreover, the probe according to the present invention are limited by the first and third penetrating holes and hence vertical contact with the pads of the circuit under test can be ensured. Then the probe will not wear easily to form an acute angle, which might puncture or scratch the pads. The limitation provided by the limiter further limits the pressure from the probe module will not be excessive, which might damage the circuit under test or pads. Besides, the probe apparatus according to the present invention is formed by connecting three sections, including the signal lead-out device, the signal transmission device, and the probe, in series. Each device can be fabricated individually before assembly and costly photo etching processes are not required. To maintain, the one thing to do is to separate the top fixing device and the signal transmission device. Then the failed part of the above three devices can be replaced. Accordingly, the objectives of easy maintenance and low costs can be achieved.

Both the signal lead-out device and the probe include solid metal at both ends and a hollow middle section. An elastic member is disposed in the middle section. The end of the signal transmission device corresponding to the probe is exposed in the second recess. The limiter includes a penetrating hole for protecting the probe as well as maintaining vertical alignment of the probe while passing through. When the probe apparatus according to the present invention tests a circuit under test and is pressed downwards, the elastic member in the middle section of the probe provides first cushioning and the elastic member in the middle section of the signal lead-out device provides second cushioning. In addition, the end of the signal transmission device corresponding to the probe is against the probe and deformed elastically towards the second recess and thus providing additional third cushioning. Furthermore, the limiter solves the problem of acute angle in the probe due to wearing, which might damage the circuit under test. Because the elastic deformation according to the present invention occurs at the end of the signal transmission device corresponding to the probe, the problems of wear or deformation owing to fatigue occur mainly at this end. To repair the whole probe apparatus, one only needs to replace the signal transmission device, enabling easy repairing. The user can do the repair rapidly without purchasing spare parts. While replacing the probe apparatus, only the probe should be replaced. It is not necessary to replace the signal transmission device and the signal-lead-out device all at a time. The fabrication of the probes requires no photo etching process via masks. Thereby, all the above reasons facilitate achieving the purpose of reducing costs.

To sum up, the present invention provides a probe apparatus, which uses a top fixing device and a bottom fixing device to clip a signal transmission device for reinforcing the mechanical strength of the signal transmission device. By shrinking the width of the probe apparatus, the purposes of easy maintenance, high-density arrangement, and low costs can be achieved. In addition, the elastic deformation of the signal transmission device is controlled in the testing process for achieving the purpose of not damaging the circuit under test.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:
1. A probe apparatus, comprising:
a signal transmission device, including a first transmission part and a second transmission part, and a first width of the first transmission part greater than a second width of the second transmission part;

a probe, with an end connected electrically the second transmission part, and the probe disposed below the second transmission part;

a bottom fixing device, disposed below the signal transmission device, the bottom fixing device having a first penetrating hole at an end, and the probe passing through the penetrating hole of the bottom fixing device;

a signal lead-out device connected electrically the first transmission part, and the signal lead-out device disposed on the first transmission part; and a top fixing device disposed on the signal transmission device, the top fixing device includes a second recess at an end, the probe is located below the second recess, the signal lead-out device passing through a second penetrating hole at the other end of the top fixing device.

2. The probe apparatus of claim 1, wherein the second penetrating hole further includes a first bore part and a second bore part; and a first bore diameter of the first bore part is smaller than a second bore diameter of the second bore part.

3. The probe apparatus of claim 2, wherein the signal lead-out device includes a first diameter part and a second diameter part; a first diameter of the first diameter part corresponds to the first bore diameter of the first bore part; and a second diameter of the second diameter part corresponds to the second bore diameter of the second bore part.

4. The probe apparatus of claim 1, wherein the first penetrating hole further includes a third bore part and a fourth bore part; and a third bore diameter of the third bore part is greater than a fourth bore diameter of the fourth bore part.

5. The probe apparatus of claim 4, wherein the probe includes a third diameter part and a fourth diameter part; a third diameter of the third diameter part corresponds to the third bore diameter of the third bore part; and a fourth diameter of the fourth diameter part corresponds to the fourth bore diameter of the fourth bore part.

6. A probe apparatus, comprising:

a signal transmission device, including a first transmission part and a second transmission part, and a first width of the first transmission part greater than a second width of the second transmission part;

a probe, with an end connected electrically the second transmission part, and the probe disposed below the second transmission part;

a bottom fixing device, disposed below the signal transmission device, the bottom fixing device having a first penetrating hole at an end, and the probe passing through the penetrating hole of the bottom fixing device, wherein the bottom of the end of the bottom fixing device includes a first recess and the probe is located in the first recess;

a substrate, disposed below the bottom fixing device, and having an opening; and a limiter, corresponding to the first recess and located in the opening and the probe passing through the limiter.

* * * * *